(12) United States Patent
Kupec et al.

(10) Patent No.: US 12,191,610 B2
(45) Date of Patent: Jan. 7, 2025

(54) BLIND PLUG, DATA TRANSMISSION SYSTEM AND METHOD FOR INDICATING A POWER SUPPLY CAPABILITY

(71) Applicant: Reichle & De-Massari AG, Wetzikon (CH)

(72) Inventors: Jan Kupec, Wetzikon (CH); Matthias Gerber, Rüti ZH (CH); Nikolas Gerber, Rüti ZH (CH)

(73) Assignee: Reichle & De-Massari AG, Wetzikon (CH)

( * ) Notice: Subject to any disclaimer, the term of this patent is extended or adjusted under 35 U.S.C. 154(b) by 601 days.

(21) Appl. No.: 17/511,809

(22) Filed: Oct. 27, 2021

(65) Prior Publication Data

US 2022/0140546 A1 May 5, 2022

(30) Foreign Application Priority Data

Oct. 29, 2020 (DE) ...................... 10 2020 128 513.2

(51) Int. Cl.
*H01R 13/717* (2006.01)
*H01R 12/70* (2011.01)
*H01R 13/52* (2006.01)

(52) U.S. Cl.
CPC ..... *H01R 13/7175* (2013.01); *H01R 12/7011* (2013.01); *H01R 13/5213* (2013.01)

(58) Field of Classification Search
None
See application file for complete search history.

(56) References Cited

U.S. PATENT DOCUMENTS

| | | | |
|---|---|---|---|
| 5,692,925 A | 12/1997 | Bogese | |
| 7,384,300 B1 * | 6/2008 | Salgado | H01R 13/7035 439/489 |
| 8,113,721 B1 * | 2/2012 | Zhovnirovsky | G02B 6/3885 385/100 |
| 8,376,760 B1 * | 2/2013 | Kostrzewski | G06F 21/86 439/138 |
| 2012/0270436 A1 | 10/2012 | Blythe | |
| 2019/0363493 A1 * | 11/2019 | Sironi | H02H 1/0007 |
| 2020/0110226 A1 * | 4/2020 | Leigh | H01R 13/4538 |
| 2020/0228166 A1 * | 7/2020 | Scherer | H02J 50/80 |

FOREIGN PATENT DOCUMENTS

| | | |
|---|---|---|
| GB | 2527310 A | 12/2015 |
| WO | 00/17968 A1 | 3/2000 |
| WO | WO-2019100555 A1 * | 5/2019 ........... H01R 13/665 |

OTHER PUBLICATIONS

German Search Report of Aug. 30, 2021 in connection with German Patent Application, DE 10 2020 128 513.2 (and English Machine Translation.).
Extended European Search Report of Mar. 17, 2022 in connection with European Patent Application No. 21204972.0 (and English translation).

* cited by examiner

*Primary Examiner* — Tho D Ta
(74) *Attorney, Agent, or Firm* — Posz Law Group, PLC

(57) ABSTRACT

A blind plug, in particular an RJ45 blind plug, includes at least one data plug unit, which is configured for a connection to a counter data plug unit, in particular an RJ45 plug socket, wherein the data plug unit includes an output unit, which is configured to indicate a power supply capability of the counter data plug unit.

15 Claims, 6 Drawing Sheets

Figure 1:
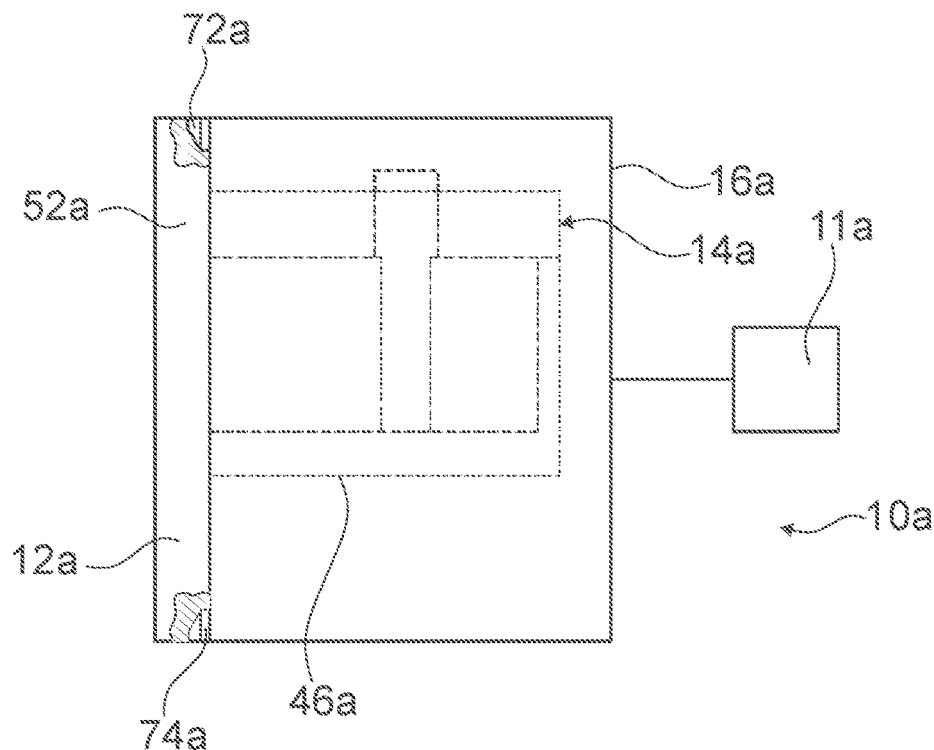

BLIND PLUG, DATA TRANSMISSION SYSTEM AND METHOD FOR INDICATING A POWER SUPPLY CAPABILITY

CROSS REFERENCE TO RELATED APPLICATION

This application is based on and incorporates herein by reference German Patent Application No. DE 10 2020 128 513.2 filed on Oct. 29, 2020.

PRIOR ART

The invention concerns a blind plug, a data transmission system and a method for indicating a power supply capability.

From the prior art a data transmission system, in particular an RJ45 system, is already known, which is configured to provide a PoE (Power over Ethernet) connection. Moreover, a data plug unit of the data transmission system is already known, which is connectable to a counter data plug unit, in particular an RJ45 plug socket, of the data transmission system, wherein the counter data plug unit defines a PoE terminal for a PoE connection. By means of a test plug of the data transmission system it is possible to check whether an electrical voltage is present at the counter data plug unit and whether it is the PoE terminal. For the purpose of testing the electrical voltage, the test plug is connectable to the counter data plug unit, wherein the test plug is once more separated from the counter data plug unit after the checking.

Furthermore, a blind plug, in particular an RJ 45 blind plug, is also known from the prior art, which is insertable in the counter data plug unit for dust protection.

The objective of the invention is in particular to provide a generic device with improved characteristics regarding efficiency. The objective is achieved according to the invention by the features of claims 1, 16 and 17 while advantageous implementations and further developments of the invention may be gathered from the subclaims.

Advantages of the Invention

The invention is based on a blind plug, in particular an RJ45 blind plug, with at least one data plug unit, which is configured for a connection to a counter data plug unit, in particular an RJ45 plug socket.

It is proposed that the data plug unit comprises an output unit, which is configured to indicate a power supply capability of the counter data plug unit.

Such an implementation permits achieving a high degree of efficiency, in particular in regard to operative and/or cost efficiency. The output unit permits a determination whether the counter data plug unit is a classic Ethernet terminal or a PoE (Power over Ethernet) terminal. The power supply capability can thus be tested by Ethernet systems. Moreover, the counter data plug unit, in particular the electronics of the counter data plug unit, can be protected from dust and/or external influences by means of the blind plug. It is therefore possible, due to the multi-functionality of the blind plug, to dispense with additional devices, in particular test plugs and/or separate dust protection. The data transmission system is furthermore capable of identifying the connected blind plug via a query impulse of the data transmission system and of adapting an actuation of the blind plug to the blind plug, and/or of controlling and/or regulating an actuation of the blind plug.

The data transmission system, in particular the RJ45 system, may comprise, for example, at least one network, in particular Local Area Network (LAN), preferably Ethernet network. The data transmission system is configured to provide at least one data connection, in particular Ethernet connection, for a transmission of data between at least one Power Sourcing Equipment (PSE) of the data transmission system and a receiver unit of the data transmission system. The receiver unit could, for example, be a Power Device (PD) or a blind plug according to the invention, in particular an RJ45 blind plug. The PSE could be, for example, a router and/or a hub and/or advantageously a switch. Preferably the data transmission system is capable of providing, in addition to the data connection, a power supply for the receiver unit. A so-called PoE (Power over Ethernet) connection provided by the data transmission system is in particular designed for a simultaneous transmission of the data signal, in particular an LAN signal, and a power supply to the receiver unit. It would be conceivable that the PD is, for example, a stationary surveillance camera and/or a VoIP telephone and/or an IP telephone and/or a computer and/or a flat screen and/or an alarm system.

Preferably the data transmission system comprises the counter data plug unit, in particular the RJ45 plug socket, for a connection between the receiver unit and the PSE. The counter data plug unit comprises at least two counter contacts, preferably eight counter contacts. The counter contacts could, for example, be made at least partially and/or to a large extent of a metal, in particular copper or gold, and/or of a different electrically conductive material and/or of a composite material. Here the term "to a large extent" is to mean for example by at least 55%, advantageously by at least 65%, preferably by at least 75%, particularly preferentially by at least 85%, and especially advantageously by maximally 95% of a volume and/or mass fraction.

In particular, the counter contacts respectively form pairs, the counter contacts in particular form four pairs. In particular, at least two of the pairs of counter contacts are configured for a transmission of the data signal and/or of the power supply. For example, exactly two of the pairs of counter contacts could transmit the data signal and/or the power supply. In particular, a PoE connection via two of the pairs of counter contacts means a PoE Type 1 connection, in particular according to the standard IEEE 802.3af. It would however also be conceivable that a PoE Type 2 connection, in particular according to the standard IEEE 802.3at, can be established via two of the pairs of counter contacts. Alternatively, four of the pairs of counter contacts could transmit the data signal and/or the power supply. In particular, a PoE connection running over four of the pairs of counter contacts is a PoE Type 3 connection or a PoE Type 4 connection, in particular according to the standard IEEE 802.3bt (Type 3) or according to the standard IEEE 802.3bt (Type 4). The data signal and the power supply could, for example, be transmittable via two different pairs of the pairs of counter contacts. Alternatively, the pair of counter contacts which transmits the data signal could be identical to the pair of counter contacts which transmits the power supply. It would however also be conceivable that the data signal is transmittable via four of the pairs of counter contacts and the power supply can be provided by two of these four pairs of counter contacts. Preferably, in a possible PoE connection the power supply capability of the counter data plug unit can be measured and/or indicated, in particular at at least two of the pairs of counter contacts. In particular, the blind plug indicates the power supply capability of at least two of the pairs of counter contacts. Preferably the blind plug may be configured for indicating a PoE Type connection. Alternatively or additionally, it could be possible to have the blind plug indicate those pairs of counter contacts via which the PoE connection, in particular the PoE Type connection, is realized.

In at least one operation state the data signal and/or power supply could be transmittable between the counter data plug unit and the receiver unit. Preferably, in a mounted state, the blind plug is connected to the counter data plug unit, such that in the operation state the blind plug checks and indicates the power supply capability of the counter data plug unit for the PoE connection. The PSE in particular checks and/or detects whether at least the PD or the blind plug is connected to the counter data plug unit. If the PD is connected to the counter data plug unit, the PSE could enable and/or regulate the transmission of the data signal and of the power supply, in particular of a PoE voltage. The PSE could in particular detect whether the blind plug is in the mounted state connected to the counter data plug unit.

For the purpose of checking whether a PoE connection can be created to the receiver unit, in particular whether a PD is connected to the counter data plug unit, the data transmission system may carry out at least one test or several different tests. For example, the PSE simulates the PD. Alternatively and preferably, the PSE could detect the receiver unit by a detection signal. In particular, the detection signal comprises at least one query impulse, in particular several individual query impulses. The PSE could transmit at least the query impulse to the receiver unit. In particular, the query impulse is standardized. The query impulse could have a test voltage, for example, of at least 2.8 V, advantageously of at least 10 V and particularly preferentially of no more than 30 V, and could have a query period, for example, of at least 0.1 s, advantageously of at least 0.2 s and particularly preferentially of no more than 0.5 s. The query impulse in particular has a short circuit current, for example, of maximally 2 mA, preferably of maximally 3 mA and particularly preferentially of maximally 5 mA. It would be conceivable that the PSE repeats the test, in particular the query impulse, for example in a rhythm of in particular 5 seconds, preferably 3 seconds and particularly preferentially 2 seconds until the PSE detects a connected PD.

In at least one of the tests the PSE could detect the connected PD if at least a load of in particular at least 19 kOhm, preferably at least 23 kOhm and advantageously no more than 26.5 kOhm is detectable. In particular, a capacity of the connected PD is limited to, for example, at least 100 nF, preferably at least 120 nF and particularly preferentially 150 nF. Alternatively, the PSE could reject the detected receiver unit as the connected PD if the load is in particular smaller than 15 kOhm or preferably exceeds at least 33 kOhm.

In the mounted state and in the at least one operation state, the PSE checks the receiver unit, which is connected to the counter data plug unit. In particular, the PSE recognizes the blind plug. Preferably the blind plug is in the mounted state and in the operation state connected to the counter data plug unit via the data plug unit and is capable of indicating the power supply capability of the counter data plug unit, in particular of the PSE, by means of the output unit.

In the at least one operation state, the output unit is in at least one output state for an optical and/or acoustic output, in particular indication, for an operator. In the output state the output unit may indicate the present power supply capability of the counter data plug unit optically, for example by a light signal, and/or acoustically, for example by a signal tone. Alternatively or additionally, the output unit may in the output state send and/or transmit a signal, for example a radio signal, to an external device, for example a mobile end device, in particular a smartphone.

In the mounted state, and in particular in the at least one operation state, the blind plug preferably provides a dust protection for the counter data plug unit.

"Configured" is to mean specifically programmed, designed and/or equipped. By an object being configured for a certain function is to be understood that the object fulfills and/or executes said certain function in at least one application state and/or operation state.

It is furthermore proposed that in at least one operation state, in particular in the at least one operation state, at least one electrical parameter of the output unit is below or above a limit value of the electrical parameter for a detection as a Power Device (PD). This allows further increasing efficiency as the PSE creates a PoE connection to a PD and supplies the PD with a data signal and with a PoE voltage only if the PSE detects the PD. As in performance-limited PSEs a number of counter data plug units with which to create the PoE connection is limited, the connected blind plug can be detected by means of the query impulse. The PSE may thus actuate by the data signal and the PoE voltage only a counter data plug unit that is connected to the PD, which results in a further optimization of efficiency in regard to an actuation of the receiver unit.

In particular, the electrical parameter is the aforementioned load. Preferably the PSE could detect the blind plug if the electrical parameter, in particular the load, is advantageously smaller than 15 kOhm. In at least the mounted state and in the at least one operation state, the PSE may provide merely the power supply for the blind plug. Preferably the PSE operates the blind plug, in particular the output unit, with the detection signal, in particular with the test voltage of the query impulse.

It would be conceivable that the output unit comprises an electronic paper (e-paper, ePaper). Advantageously the output unit comprises at least one lighting member, in particular an LED. This enables an efficiency in regard to an energy-efficient and compact construction of the output unit. It is moreover possible, due to current-limiting of the data transmission system, in particular of the PSE, that the lighting member is connected to the counter data plug unit directly, in particular via a direct electrical contact, such that the output unit is free of a series resistor.

The lighting member could, for example, be a green or blue LED. Preferably the LED is orange-red or red. Particularly preferentially the light emitted by the lighting member could have a wavelength that is in particular at least 600 nm, preferably at least 625 nm and advantageously no more than 640 nm. In particular, the lighting member is a low-current LED. In the at least one operation state, the LED implemented as a low-current LED may glow with a power supply that is in particular at least 5 mA, advantageously at least 2 mA and particularly preferentially already with a power supply that is at least 1 mA. It would be conceivable that the LED indicates the query impulse directly. Herein the LED could blink in at least the output state. For example, the LED could in the indicating state, for example, emit light for at least 0.5 s and could be switched off for at least 1.5 s. Alternatively, the LED could in an output state glow continuously; in particular, the LED glows continuously if in the at least one operation state the PSE simulates the PD. In a further output state of the output unit the LED could be switched off completely.

It is also proposed that the data plug unit has at least one printed circuit board comprising contacts for a contacting with counter contacts of the counter data plug unit. This enables an energy-efficient and precise electrical contacting between the data plug unit, in particular the LED, and the counter data plug unit.

The printed circuit board has at least an upper side and an underside. The contacts could, for example, be arranged on the upper side or on the underside of the printed circuit board. Preferably the contacts extend over a side of the printed circuit board that faces the counter data plug unit, in particular a front side of the printed circuit board. The side of the printed circuit board that faces toward the counter data plug unit extends at least substantially perpendicularly to the upper side and to the underside. The contacts may, for example, be implemented at least partially and/or to a large extent of a metal, in particular copper or gold, and/or of a different electrically conductive material and/or of a composite material. In particular, the contacts could in regard to their number be adapted to a number of counter contacts. The printed circuit board may preferably comprise eight contacts. The contacts may respectively form pairs which are connectable to the pairs of counter contacts. In particular, the printed circuit board comprises four pairs of contacts. Advantageously the data signal and/or the power supply is transferred via the contacts and the counter contacts, in particular via respectively two connected pairs of contacts and counter contacts. For example, in the at least one operation state two of the pairs of contacts may transfer the data signal and/or the power supply between the receiver unit and the counter contacts. It would however be also conceivable that in the at least one operation state four of the pairs of contacts provide the data signal and two of the pairs of contacts, in particular two pairs of contacts which are identical to the four pairs of contacts, provide the power supply. Alternatively, four of the pairs of contacts may transfer the data signal and the power supply.

In a further implementation of the invention it is proposed that the printed circuit board comprises at least one first conduction path, which connects a first one of the contacts to a first terminal of the lighting member in an electrically conductive manner, and at least one second conduction path, which connects a second one of the contacts to a second terminal of the lighting member in an electrically conductive manner, the lighting member being connected in an electrically conductive manner to at least two of the contacts via said conduction paths. This allows further increasing an efficiency in regard to an electrical contact reliability between the data plug unit, in particular the LED, and the counter data plug unit. Moreover, by means of the first conduction path and the second conduction path it may be explicitly determined whether a power supply is possible via at least the first one of the contacts and at least the second one of the contacts.

The lighting member could be arranged on the underside of the printed circuit board. Preferably the lighting member is connected to at least two pairs of contacts, in particular to four contacts. It would be conceivable that the first one of the contacts forms a first pair of contacts together with an additional first contact of the contacts, in particular a neighboring contact of the first contact. The first conduction path may comprise at least one first conduction path section, which is connected to the first one of the contacts. In addition, the first conduction path may comprise an additional first conduction path section, in particular a conduction path section neighboring the first conduction path section, which is connected to the additional first contact.

Advantageously the first conduction path section and the additional first conduction path section are implemented at least partly integrally, in particular short-circuited with each other. The first conduction path may connect the first terminal of the lighting member to the first pair of contacts, in particular the first contact and the additional first contact, via the first conduction path section and the additional first conduction path section. Alternatively or additionally the second one of the contacts may form a second pair of contacts together with an additional second one of the contacts. The second conduction path may comprise at least one second conduction path section, which is connected to the second one of the contacts. Additionally, the second conduction path may comprise an additional second conduction path section in addition to the second conduction path section, which is connected to the additional second contact. Advantageously, the second conduction path section and the additional second conduction path section are at least partly integrally connected to each other, in particular short-circuited with each other. The second conduction path may connect the second terminal of the lighting member to the second pair of contacts, in particular to the second contact and the additional second contact, via the second conduction path section and the additional second conduction path section.

It would be conceivable that the first conduction path, in particular the first contact and the additional first contact, has/have a positive voltage and the second conduction path, in particular the second contact and the additional second contact, has/have a negative voltage. Preferably the first conduction path, in particular the first contact and the additional first contact, may have a negative voltage and the second conduction path, in particular the second contact and the additional second contact, may have a positive voltage.

In order to further augment efficiency in regard to flexibility, it is proposed that the output unit comprises a further lighting member, in particular a further LED, and the printed circuit board comprises at least one further first conduction path connecting, in an electrically conductive manner, a further first one of the contacts to a further first terminal of the further lighting member, and comprises at least one further second conduction path connecting, in an electrically conductive manner, a further second one of the contacts to a further second terminal of the further lighting member, the further lighting member being connected to at least further two contacts of the contacts via the further first conduction path and the further second conduction path in an electrically conductive manner. This allows augmenting efficiency in regard to flexibility as all four contact pairs of contacts, in particular all eight contacts, are connected to the counter contacts, in particular the eight counter contacts, by the lighting member and the further lighting member, and the power supply capability of the counter data plug unit can be indicated independently from an actuation by the PSE. Moreover, a classification of the PoE type connection, in particular an IEEE standard, is enabled by the lighting member and the further lighting member. It is furthermore possible to determine via which of the contacts, in particular which pairs of contacts, there is a PoE connection to the PSE.

The further lighting member, in particular the further LED, may be identical to the lighting member, in particular the LED. Alternatively the further lighting member could have at least one technical function that differs from the lighting member. In particular, the further LED could have a color differing from the LED. The further lighting member could be arranged on the underside of the printed circuit board. Preferably the further lighting member is connected to at least two further pairs of contacts, in particular to further four contacts. The further two pairs of contacts in particular differ from the two pairs of contacts which the lighting member is connected to. It would be conceivable that the further first one of the contacts forms together with a further additional first contact of the contacts, in particular a further contact that neighbors the further first contact, a further first pair of contacts. The further first conduction path may comprise at least one further first conduction path section, which is connected to the further first one of the contacts. In addition, the further first conduction path may comprise a further additional first conduction path section, in particular a further conduction path section neighboring the further first conduction path section, which is connected to the further additional first contact. Advantageously the further first conduction path section and the further additional first conduction path section are implemented at least partly integrally, in particular short-circuited with each other. The further first conduction path could connect, via the further first conduction path section and the further additional first conduction path section, the further first terminal of the further lighting member to the further first pair of contacts, in particular the further first contact and the further additional first contact. Alternatively or additionally, the further second one of the contacts may together with a further additional second one of the contacts form a further second pair of contacts. The further second conduction path may have at least one further second conduction path section, which is connected to the further second one of the contacts. Additionally, the further second conduction path may have a further additional second conduction path section in addition to the further second conduction path section, which is connected to the further additional second contact. Advantageously, the further second conduction path section and the further additional second conduction path section are connected at least partly integrally, in particular short-circuited with each other. The further second conduction path may connect, via the further second conduction path section and the further additional second conduction path section, the further second terminal of the further lighting member to the further second pair of contacts, in particular the further second contact and the further additional second contact. The further first contact may be neighboring to the further additional first contact. Alternatively or additionally, the further second contact may be neighboring to the further second contact.

It would be conceivable that the further first conduction path, in particular the further first contact and the further additional first contact, has/have a positive voltage and the further second conduction path, in particular the further second contact and the further additional second contact, has/have a negative voltage. Preferably the further first conduction path, in particular the further first contact and the further additional first contact, may have a negative voltage and the further second conduction path, in particular the further second contact and the further additional second contact, may have a positive voltage.

In the at least one operation state, the lighting member and/or the further lighting member could indicate a type of the PoE connection, in particular an IEEE standard. In particular, in the at least one operation state, the LED or the further LED could glow if there is the PoE type 1 connection, in particular the standard IEEE 802.3af, or if there is the PoE type 2 connection, in particular the standard IEEE 802.3at. Alternatively, the LED and the further LED could glow together in the at least one operation state, thus indicating the PoE type-3 connection or the PoE type-4 connection, in particular the standard IEEE 802.3bt (type 3) or the standard IEEE 802.3bt (type 4).

Beyond this it is proposed that the first conduction path and/or the second conduction path extend/s over an edge of the printed circuit board. Alternatively or additionally, the further first conduction path and/or the further second conduction path could extend over the edge of the printed circuit board. This allows further augmenting efficiency in regard to an electrical contacting between the data plug unit and the counter data plug unit. Moreover, an optimized, compact and especially thin implementation of the printed circuit board is enabled. It is further possible to provide cost efficiency, in particular in a production of the printed circuit board, contact reliability with the counter data plug unit remaining the same. Furthermore, in the production of the printed circuit board, in at least one method step a mask may be applied onto the surface of the printed circuit board, which protects the conduction paths. Thus, in the at least one method step, a processing with a solder mask can be dispensed with in the production of the printed circuit board.

The edge could be located on that side of the printed circuit board that faces toward the counter data plug unit, in particular on the front side of the printed circuit board. For example, the edge may have recesses. In particular, a number of recesses corresponds to a number of contacts, preferably an RJ45 standard. Preferably the conduction path and/or the second conduction path connect/s the upper side of the printed circuit board electrically to the underside of the printed circuit board. In particular, the first conduction path section and the additional first conduction path section, in particular alternatively or additionally the further first conduction path section and the further additional first conduction path section, may be arranged on the upper side of the printed circuit board and may be implemented at least partly integrally. In addition, the second conduction path section and the additional second conduction path section, in particular alternatively or additionally the further second conduction path section and the further additional second conduction path section, may be arranged on the upper side of the printed circuit board and may be implemented at least partly integrally. On the underside of the printed circuit board, the first terminal and/or the second terminal, in particular and/or the further first terminal and/or the further second terminal, could be located. The first conduction path and/or the second conduction path may, for example, be made at least partly and/or to a large extent of a metal, in particular copper or gold, and/or of a different electrically conductive material and/or of a composite material. In at least one method step for the production of the printed circuit board, the edge which is to be metalized for the first and/or the second conduction path could be milled and/or punched out and/or lasered prior to at least one through-hole plating process. It would also be conceivable that in the method step for the production of the printed circuit board, in particular of the recesses, the printed circuit board is milled over at least 20%, preferably at least 30% and especially preferentially at least 50% of a thickness of the printed circuit board. In at least one further method step for the production of the printed circuit board, in particular a through-hole plating, the edge, in particular the recesses, could be metalized.

The upper side may have a mask, which is configured to at least partly, preferably completely, cover the first conduction path section and/or the additional conduction path section and/or the second conduction path section and/or the additional second conduction path section.

If the blind plug comprises a housing unit which is configured to accommodate at least the output unit, the output unit can be protected from external influences, for example dust and/or water, such that a compact and secure construction is enabled. As the housing unit is advantageously made in one piece from a cast, efficiency in regard to a production process of the blind plug can be maximally increased and the blind plug can be produced in a manner that is both cost-efficient and simple, in particular for mass production. It is also possible to adapt dimensions of the housing unit to the dimensions of any counter data plug units.

Preferably the housing unit implements the dust protection for the counter data plug unit, serving at the same time as a holder for the output unit. The housing unit may, for example, be made at least partly and/or to a large extent of a mineral, in particular a glass, and/or of a metal and/or preferably of a synthetic material, in particular a thermoplastic, and/or of a composite material. It would be conceivable that the housing unit comprises at least one material that is identical to the data plug unit, in particular the output unit and/or the printed circuit board. In particular, the housing unit is implemented in one piece and is formed, for example, by a welding process, an adhesive process, an injection-molding process and/or a different process that is deemed expedient by someone skilled in the art. Preferably the housing unit is formed in one piece via an injection-molding procedure. For example, the housing unit could be producible from a cast and/or by a one-component or multi-component injection molding procedure.

It is further proposed that the housing unit is connected to the printed circuit board. This allows obtaining an advantageously simple and cost-efficient construction of the blind plug. It is moreover possible to dispense with an additional carrier unit and/or with an insulation unit for the printed circuit board. In this way it is possible to provide a simple and cost-efficient mounting of the printed circuit board on the housing unit.

For example, the printed circuit board may be connected to the housing unit via a force-fit and/or form-fit connection, like for example a plug connection and/or a rotary union and/or a screw connection. Alternatively, for a fixation with the housing unit, the printed circuit board could also be connected by substance-to-substance bond, namely glued on and/or molded. Preferably the printed circuit board comprises at least one pilot hole. The pilot hole may be arranged on at least one side of the printed circuit board that is different from the edge. The printed circuit board may preferably comprise two pilot holes positioned on opposite sides of the printed circuit board. In a mounting of the printed circuit board on the housing unit, the pilot hole is preferably capable of directing an insertion of the printed circuit board in the housing unit into a position designated for the printed circuit board. In a production of the printed circuit board, the pilot hole may in at least one method step be milled and/or punched out and/or drilled and/or lasered and/or preferably cut. In at least the mounted state the printed circuit board is fixed with the housing unit. Preferably the printed circuit board may be connected and/or fixed with the housing unit merely via the pilot holes. In particular, the housing unit may comprise at least one domed guiding element, which is configured to engage in the pilot hole in the mounted state. The guiding element is preferably adapted to a shape of the pilot hole. In particular, in at least one further method step in the mounting of the printed circuit board, the guiding element may be melted to the pilot hole by substance-to-substance bond via a die stamp. It would be conceivable that the printed circuit board, in particular the side of the printed circuit board that is different from the edge, is producible via the cutting procedure in at least one method step in the production of the printed circuit board.

Beyond this it is proposed that the housing unit and the printed circuit board together form an at least substantially closed hollow space which the output unit is arranged in. In this way maximum protection of the output unit, in particular of the lighting member and/or the further lighting member, from external influences, for example dust, is enabled.

The housing unit may comprise at least one wall, in particular at least one side wall and/or a bottom wall and/or a rear wall and/or a front side wall. In particular, the rear wall defines a side of the housing unit that faces toward the counter data plug unit. The front side wall may define a side of the housing unit that faces away from the counter data plug unit. The front side wall and the rear wall are arranged at least substantially parallel to each other. In particular, two side walls are arranged between the front side wall and the rear wall, which are in particular in each case positioned at right angles to the front side wall and the rear wall, wherein an angle between a longitudinal extension of the front side wall and/or of the rear wall and a longitudinal extension of the side walls deviates in a mounted state from a right angle in particular by maximally 5°, preferably by maximally 2° and especially advantageously by maximally 1°. Together with the printed circuit board, in particular the underside of the printed circuit board, the side walls, the rear wall, the bottom wall and the front side wall may form the at least substantially closed hollow space. The lighting member and/or further lighting members, which are/is preferably arranged on the underside of the printed circuit board, may be located in the at least substantially closed hollow space.

In a further implementation of the invention, it is proposed that the housing unit is implemented so as to be at least partially transparent, in particular translucent. In this way a particularly efficient indication of the power supply capability is achievable as a glowing of the lighting member and/or of the further lighting member is perceivable by a user through the housing unit.

In particular, the material of the housing unit, in particular the synthetic material, is at least partially light-permeable, in particular translucent and/or transparent. Preferably the housing unit is made at least partially and/or to a large extent of polycarbonate (PC) and/or polyamide (PA) and/or preferably of polymethyl-methacrylate (PMMA). An at least partially transparent housing unit could in particular be at least substantially transparent, having for example a scattered-light portion of the lighting member and/or of the further lighting member that is in particular at least 3%, advantageously at least 10% and particularly advantageously no more than 30%. In particular, in an at least partially translucent housing unit the scattered-light portion may be in particular at least 30%, preferably at least 40% and particularly preferentially at least 50%. In particular, light emitted by the lighting member and/or the further lighting member exits from the at least partially translucent housing unit in a diffuse manner. Preferably the synthetic material of the housing unit transmits a light portion of at least 60%, preferably at least 80% and particularly preferentially at least 90% of the lighting member and/or the further lighting member.

It is moreover proposed that the housing unit comprises at least one fiber optic, which deflects a light path at least once. This allows further augmenting an efficiency and improving, in particular simplifying, a construction. It is further possible to facilitate an output of a power supply capability of a counter data plug unit, which in its turn results in increased comfort. An fiber optic advantageously allows a guiding of light, in particular light provided by a lighting member of the output unit.

The fiber optic may be made at least partly and/or to a large extent of a mineral, for example glass, and/or of a synthetic material and/or of a composite material. Preferentially the fiber optic is made of an at least partially light-permeable synthetic material. The fiber optic may possibly have a bent shape or a straight shape. The fiber optic could be realized at least partly in a one-part implementation and could preferably be realized in one piece. In particular, the housing unit forms the fiber optic. In the production process of the housing unit, the fiber optic may be realized at least partly in a one-piece implementation, preferably in a one-part implementation, with the housing unit. "In a one-piece implementation" is to mean at least by substance-to-substance bond, for example by an adhesive process, an injection-molding process and/or a welding process and/or by a different process that is deemed expedient by someone skilled in the art. "In one piece" may also mean "in one part". "In a one-part implementation" is to mean formed in one piece. Said piece is preferably produced from a single blank, from a mass and/or from a cast, particularly preferentially in an injection-molding procedure, in particular a one-component and/or multi-component injection-molding procedure, and/or in a punching procedure from the single blank.

The fiber optic is configured for guiding light, preferably provided light, from the lighting member and/or the further lighting member, in particular directly and advantageously without processing, toward at least one front side of the housing unit. Advantageously the light path is a light path of the provided light, starting from the lighting member and/or the further lighting member. In particular, the fiber optic defines a light receiving region. The fiber optic may comprise at least one planar entry region for the light, in particular for the light provided by the lighting member and/or the further lighting member, which is advantageously adapted to a dimension and/or shape and/or size of the lighting member and/or the further lighting member. The lighting member and/or the further lighting member may be aligned at least substantially perpendicularly to the entry region of the fiber optic, radiating light at least substantially perpendicularly onto the entry region. By "at least substantially" is to be understood, in this context, that a deviation from a given value is less than 25%, preferably less than 10% and especially preferentially less than 5% of the given value. "At least substantially perpendicularly" is to mean, in this context, at an angle between 85° and 95°, preferably between 88° and 92° and especially advantageously an angle of 90°.

The printed circuit board may be arranged at the housing unit perpendicularly to an insertion direction. For a further increase in efficiency, in regard to at least one of production efficiency and/or cost efficiency and/or mounting efficiency and/or demounting efficiency, it is proposed that the printed circuit board is inserted in the housing unit parallel to an insertion direction. In this way moreover a mounting and/or demounting effort are/is reducible.

The housing unit may comprise at least one guiding web. Advantageously, the housing unit comprises a guiding web and a further guiding web that is situated opposite the guiding web. The printed circuit board may be insertable and/or inserted in the housing unit along the guiding web and/or the further guiding web. In particular, the printed circuit board lies upon the guiding web and/or the further guiding web. In the mounting of the printed circuit board, in the at least one method step, the printed circuit board could be inserted in the housing unit parallel to the insertion direction, and could in particular be insertable and/or inserted in the housing unit along the guiding web and/or the further guiding web.

If the housing unit comprises at least one fixing element, which is configured for a fixation of the data plug unit, in particular the printed circuit board, with the counter data plug unit, efficiency and/or flexibility regarding a mounting of the blind plug, in particular the data plug unit, can be advantageously improved.

For example, the fixing element may be arranged on an upper side of the side wall that faces away from the bottom wall. In particular, the fixing element is connected to a side of the cover element that faces toward the counter data plug unit, in particular the side of the cover element that faces toward the rear wall. The fixing element is configured, in the mounted state, to create a clamping effect, in particular a latch connection, of the data plug unit with the counter data plug unit, and preferably to fix, in particular to latch, the data plug unit in the counter data plug unit. In particular, the fixing element may be at least partially deformable. The fixing element may, for example, be embodied as a latch tab and/or as a latch tab lever and/or as a clip. Preferably, in the production process of the housing unit the fixing element may be implemented integrally with the housing unit. Alternatively, in the production of the housing unit the fixing element could in the further method step be injection-molded and/or glued on and/or could be connected to the side wall and the cover element by a further process that is deemed expedient by someone skilled in the art.

It is furthermore proposed that the housing unit comprises at least one cover element, which covers the counter data plug unit in a flush-mounted manner. This allows providing maximum safety of the counter data plug unit as the blind plug functions as a dust protection and protects the counter data plug unit from external influences, for example dust. Moreover, for an improved functionality the cover element may have a lettering so as to distinguish between the blind plug with the PoE indicating function from customary blind plugs. It is further possible for the blind plug to be removed easily from the counter data plug unit by means of a recess in the cover element.

The cover element my define the side of the housing unit that faces away from the counter data plug unit, in particular the front side wall of the housing unit, at least partly, preferably to a large extent and particularly preferentially completely. Preferably an upper side of the cover element is arranged at least substantially in a flush-mounted fashion with a surface of a surrounding region of the counter data plug unit, in particular a side of the counter data plug unit that faces toward the blind plug. In particular, a level difference between the surface of the cover element and the surface of the surrounding region of the counter data plug unit is equivalent to in particular maximally 5%, preferably maximally 1% and particularly preferentially maximally 0.5% of a thickness of the cover element. The cover element may have at least one lettering, e. g. a logo and/or a signature and/or a pointer, on a side that faces away from the counter data plug unit. At least on an edge facing toward the counter data plug unit, the cover element may have a recess via which the blind plug, in particular the housing unit, is removable from the counter data plug unit. In particular, a recess could be arranged on at least two edges of the cover element, in particular on two opposite-situated edges of the cover element, which face toward the counter data plug unit.

The invention is furthermore based on a method for indicating a power supply capability of the counter data plug unit, wherein a blind plug is connected to the counter data plug unit and the power supply capability is indicated by the output unit.

It is proposed that the output unit is supplied by a Power Sourcing Equipment, in particular the Power Sourcing Equipment (PSE), via a detection signal for a detection of a Power Device, in particular the Power Device (PD). As a result, an efficiency regarding an actuation of the output unit and/or an indication of the power supply capability of the counter data plug unit, in particular an operation of the blind plug, can be further optimized.

Herein the blind plug shall not be limited to the application and implementation described above. In particular, in order to fulfill a functionality that is described here, the blind plug may comprise a number of individual elements, components and units that differs from a number given here.

DRAWINGS

Further advantages will become apparent from the following description of the drawings. In the drawings two exemplary embodiments of the invention are illustrated. The drawings, the description and the claims comprise a plurality of features in combination. Someone skilled in the art will purposefully also consider the features separately and will find further expedient combinations.

Figure 2:
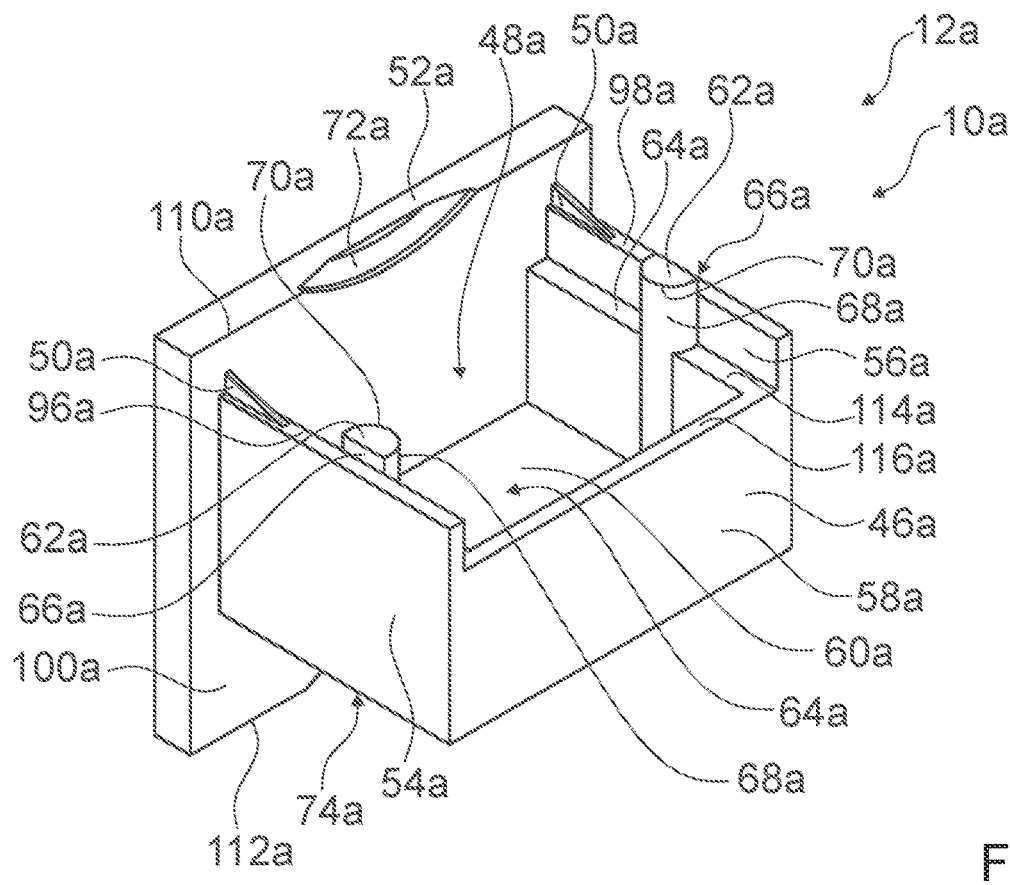
Figure 3:
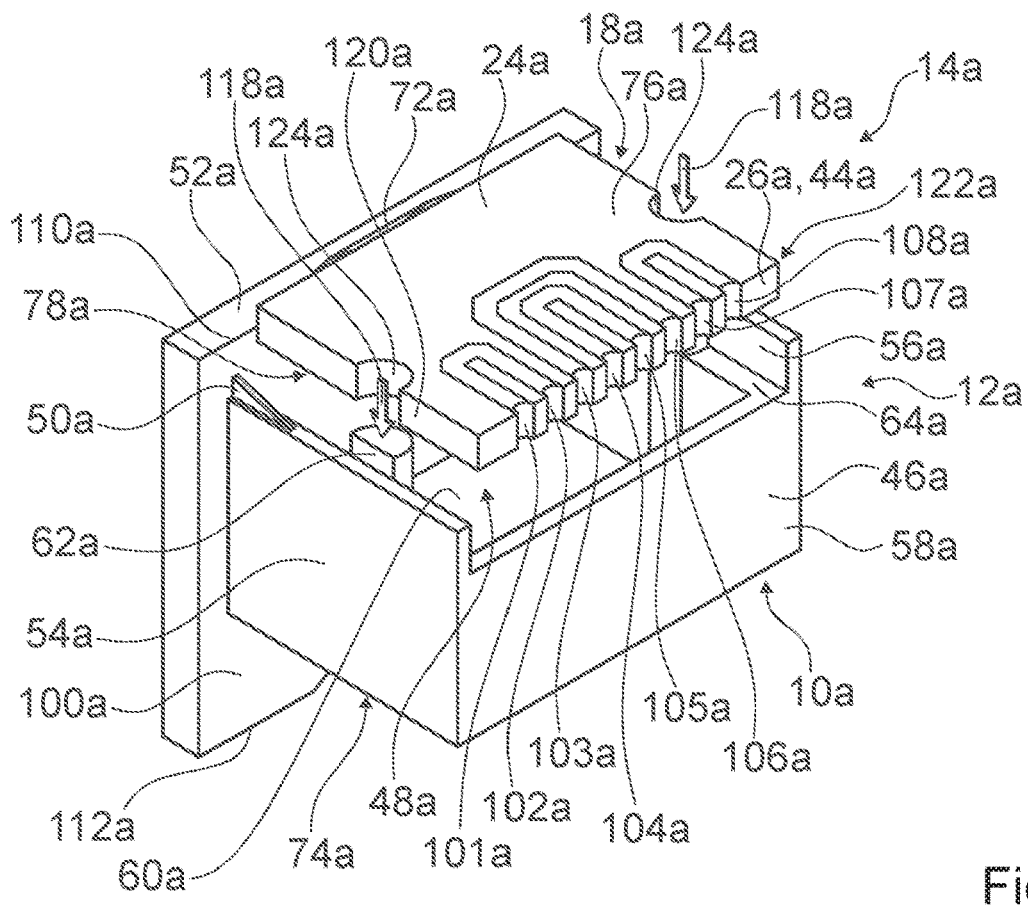
Figure 4:
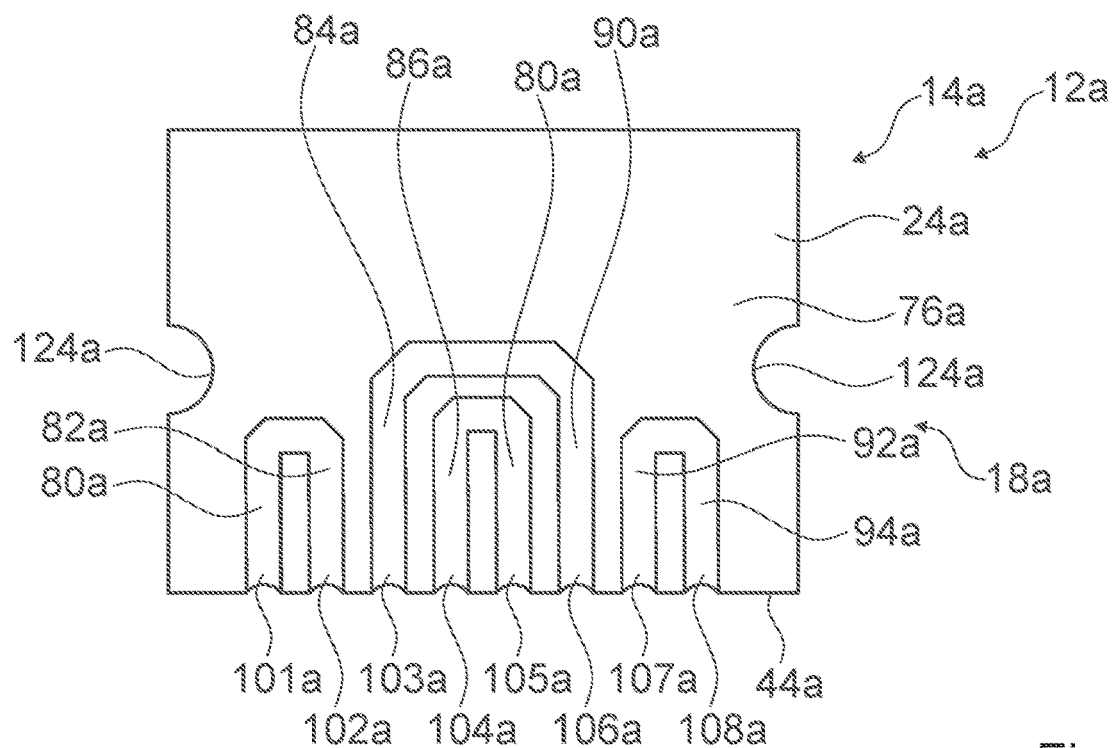
Figure 5:
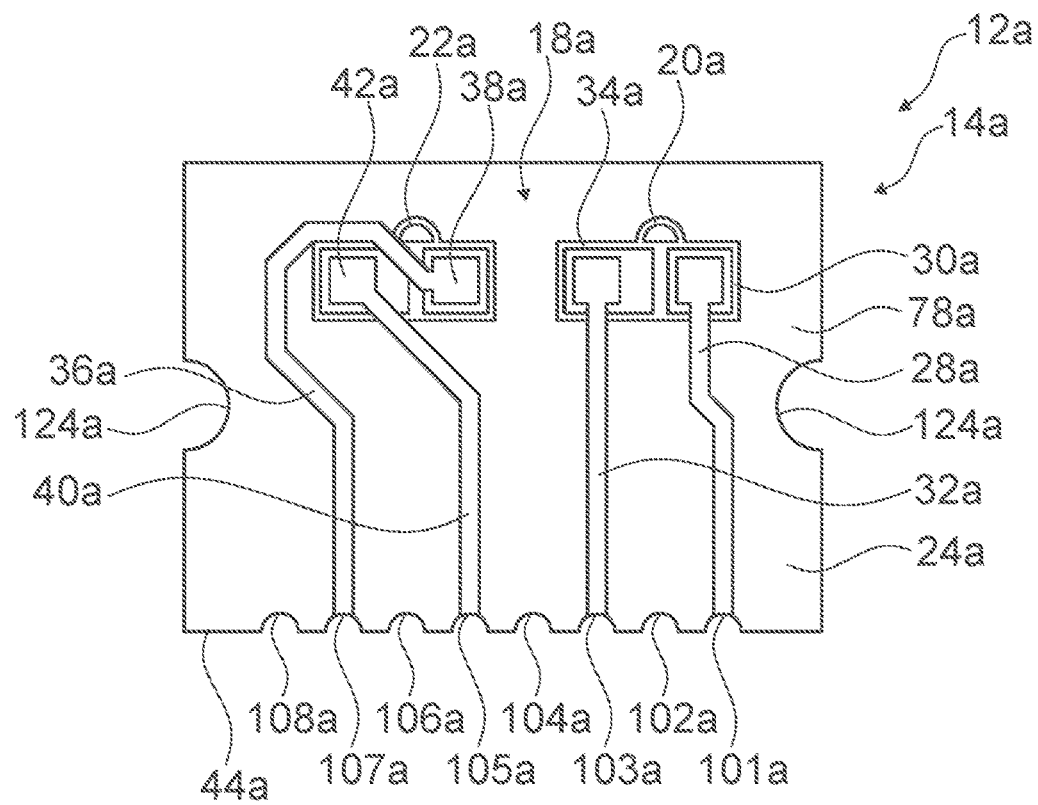
Figure 6:
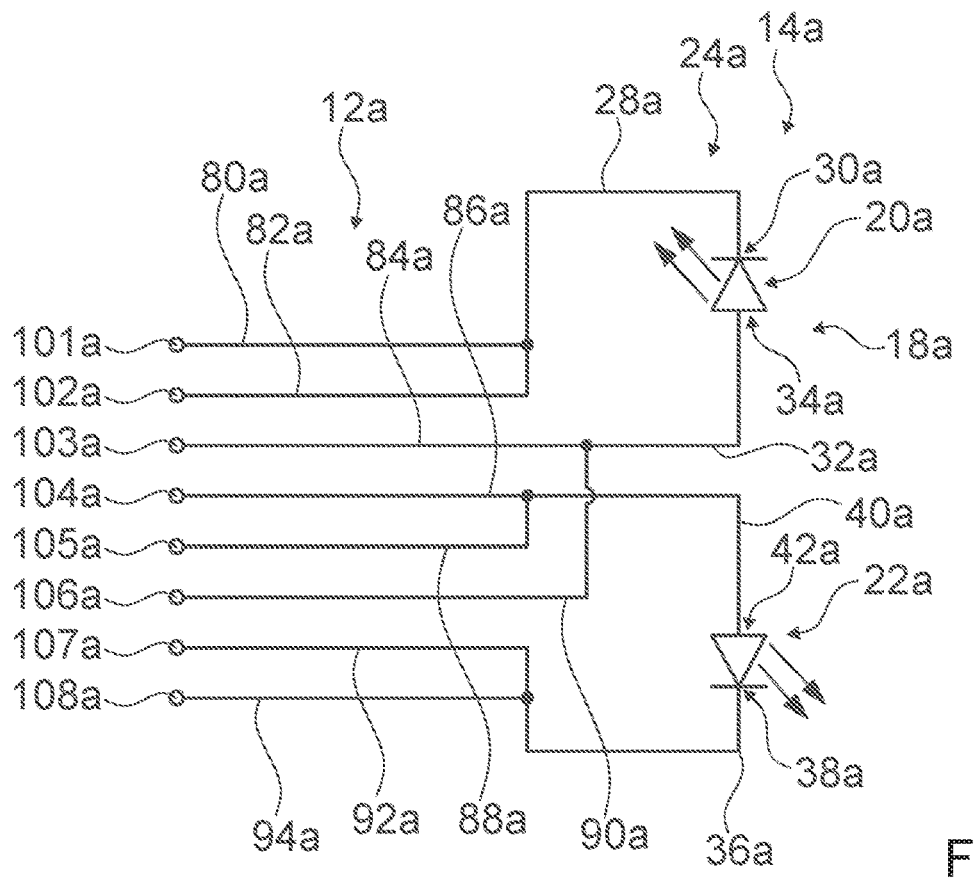
Figure 7:
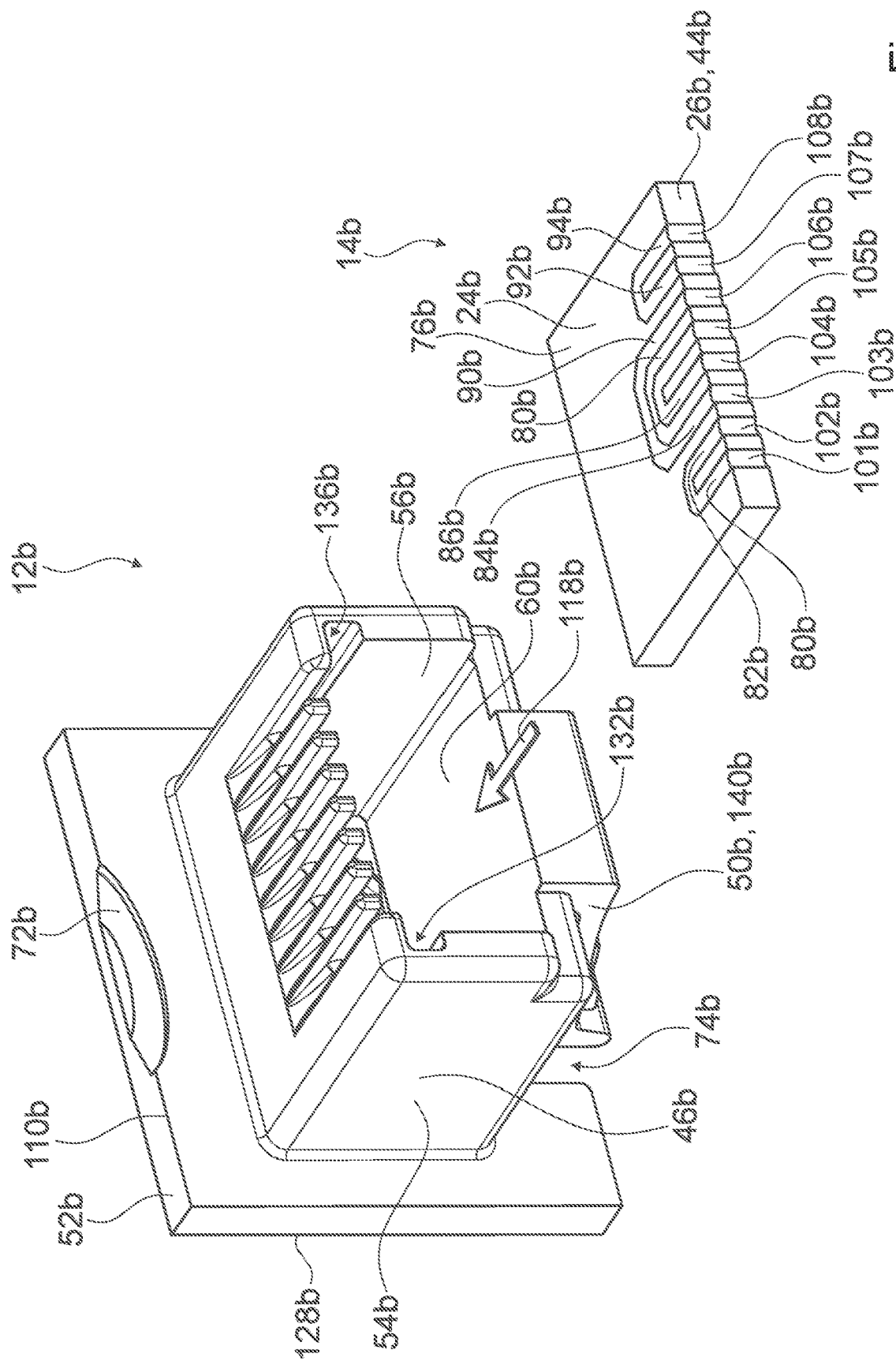
Figure 8:
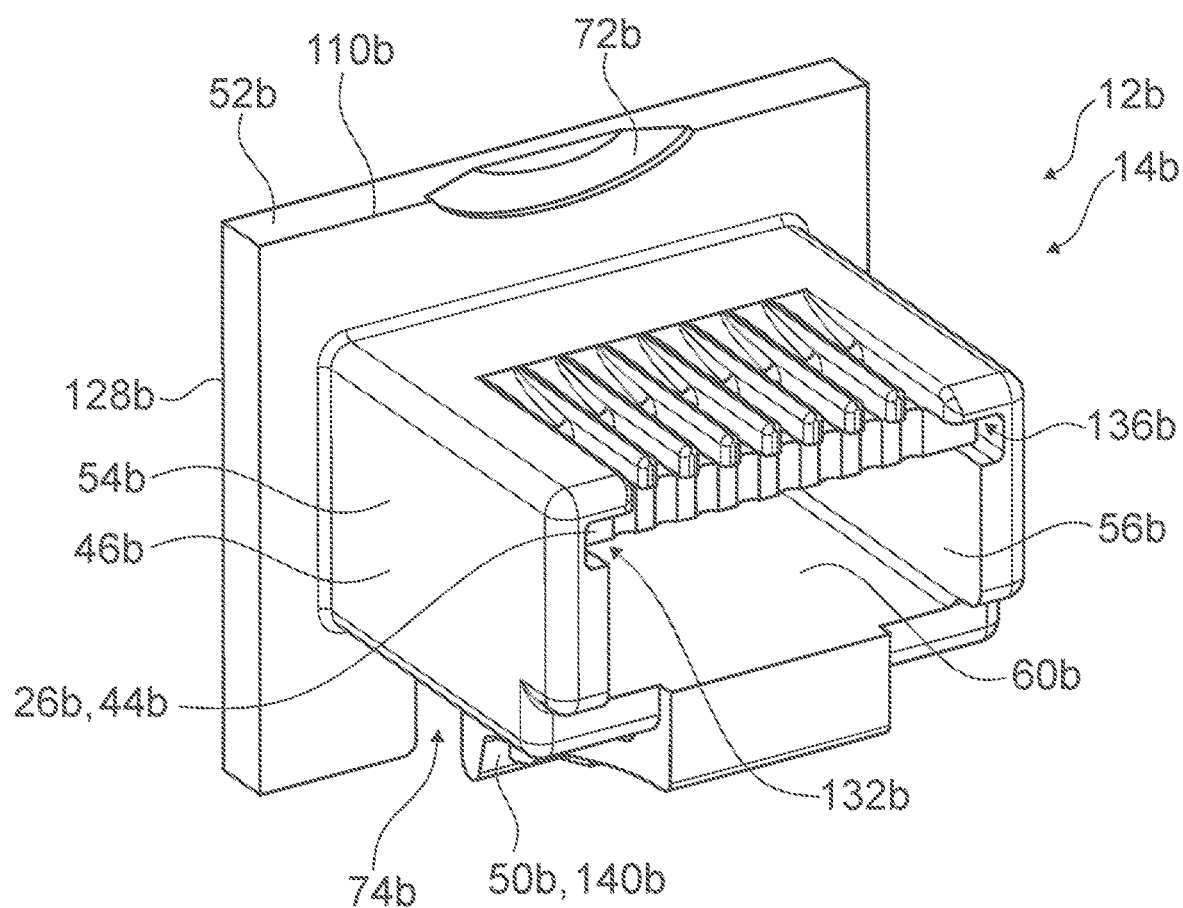
Figure 9:
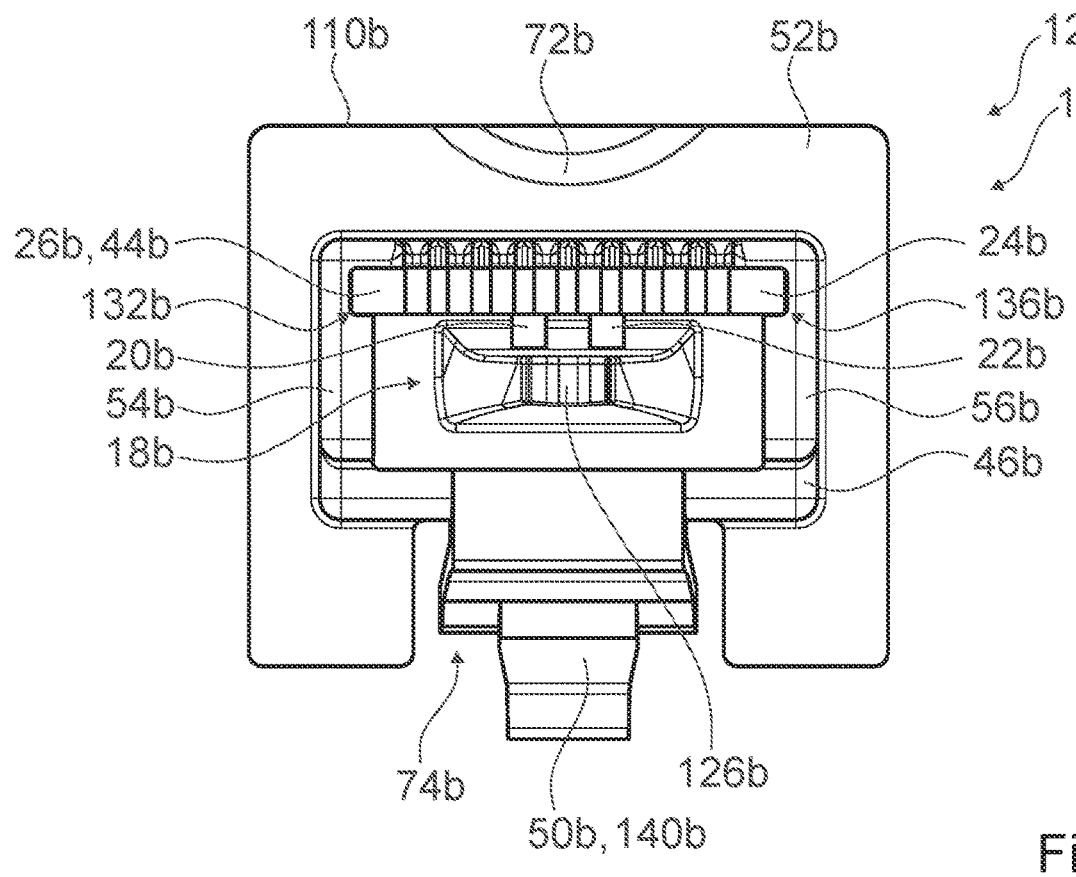
Figure 10:
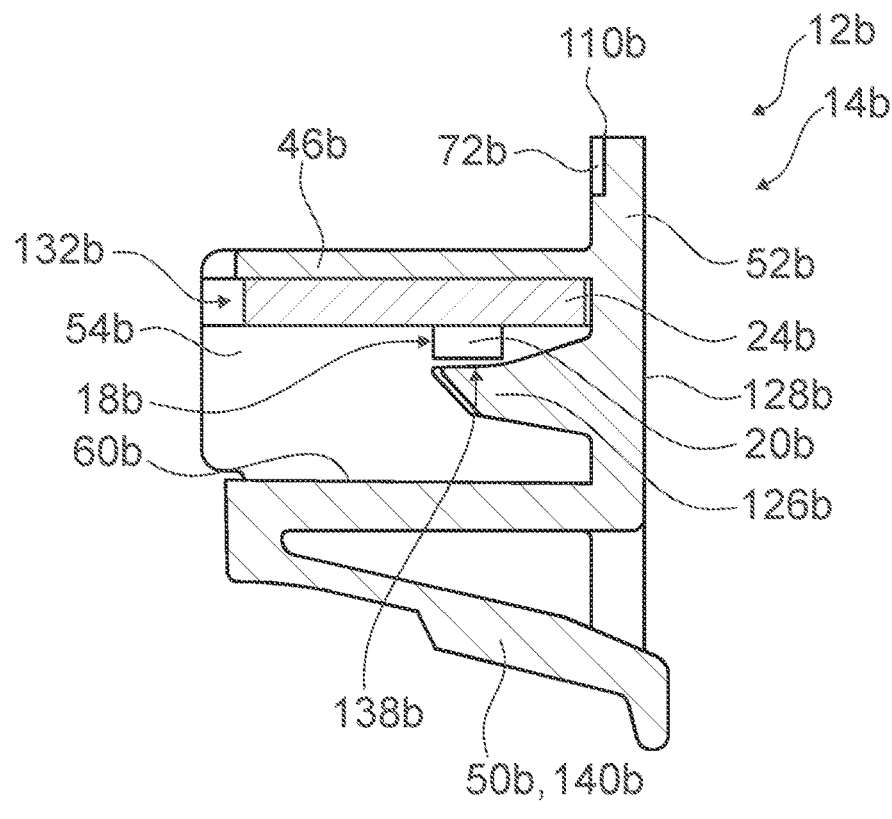

It is shown in:

FIG. 1 a data transmission system implemented as an RJ45 system, with a blind plug and with a counter data plug unit of the data transmission system, FIG. 2 a housing unit of the blind plug, FIG. 3 the housing unit with a printed circuit board of the blind plug, FIG. 4 a detail view of an upper side of the printed circuit board, FIG. 5 a detail view of an underside of the printed circuit board, FIG. 6 a schema of the printed circuit board, FIG. 7 a blind plug in a further exemplary embodiment, FIG. 8 a housing unit of the blind plug of FIG. 7 with a printed circuit board of the blind plug inserted in the housing unit, FIG. 9 a rear view of the blind plug of FIG. 7, and FIG. 10 a sectional view of the blind plug of FIG. 7.

DESCRIPTION OF THE EXEMPLARY EMBODIMENTS

FIG. 1 shows a data transmission system 10a that is implemented as an RJ45 system. In this exemplary implementation the data transmission system 10a is capable of enabling a Power over Ethernet (PoE) connection. The data transmission system 10a herein transmits a data signal of the data transmission system 10a between a PSE (Power Sourcing Equipment) 11a of the data transmission system 10a and a receiver unit of the data transmission system 10a and provides a power supply of the data transmission system 10a for the receiver unit.

For a transmission of the data signal and of the power supply, the data transmission system 10a comprises at least one counter data plug unit 16a, which is embodied as an RJ45 plug socket. The receiver unit, which is embodied as a blind plug 12a, comprises at least one data plug unit 14a. Correspondingly, the blind plug 12a is embodied as an RJ45 blind plug. In the present exemplary implementation the blind plug 12a is configured for checking a power supply capability of the counter data plug unit 16a. The blind plug 12a is moreover capable of protecting the counter data plug unit 16a from dust. In FIG. 1 a mounted state of the blind plug 12a is shown, in which the blind plug 12a is plugged into the counter data plug unit 16a.

FIGS. 2 and 3 respectively show a detailed construction of the blind plug 12a. While in FIG. 2 merely a housing unit 46a of the blind plug 12a is explicitly to be seen, FIG. 3 shows the housing unit 46a and a printed circuit board 24a of the data plug unit 14a. Furthermore, detail views of the printed circuit board 24a can be perceived in FIGS. 4 and 5, while FIG. 6 shows a schema of the printed circuit board 24a.

For a functioning of the blind plug 12a as a dust protection, the housing unit 46a comprises at least one cover element 52a. As can be seen in FIG. 1, the cover element 52a covers the counter data plug unit 16 in a flush-mounted manner. The cover element 52a defines a front side wall of the housing unit 46a. The housing unit 46a further comprises two side walls 54a, 56a, which are arranged at the cover element 52a perpendicularly. On a side of the side walls 54a, 56a facing away from the cover element 52a, the housing unit 46a has a rear wall 58a. The rear wall 58a delimits a depth direction of the housing unit 46a starting from the cover element 52a and is also arranged at the side walls 54a, 56a perpendicularly. The rear wall 58a and the cover element 52a extend at least substantially parallel to each other. The housing unit 46a has a bottom wall 60a. The bottom wall 60a is arranged perpendicularly to the side walls 54a, 56a and perpendicularly in each case to the cover element 52a and to the rear wall 58a. FIGS. 2 and 3 show that the cover element 52a, the side walls 54a, 56a, the rear wall 58a and the bottom wall 60a together define a hollow space 48a. In this exemplary implementation the housing unit 46a is embodied in one piece and is manufactured in a production process in one piece by an injection-molding procedure.

For a fixation of the data plug unit 14a with the counter data plug unit 16a, the housing unit 46a comprises at least one fixing element 50a. The fixing element 50a is arranged on a respective upper side 96a, 98a of the side walls 54a, 56a, which faces away from the bottom wall 60a. The fixing element 50a is herein connected to the cover element 52a with the side 96a, 98a and with a side 100a of the cover element 52a that faces toward the rear wall 58a. The fixing element 50a is configured, in the mounted state, to create a clamping effect of the data plug unit 14a with the counter data plug unit 16a.

For an easy removal of the blind plug 12a from the counter data plug unit 16a, the housing unit 46a has a recess 72a at an upper edge 110a of the cover element 52a, which faces toward the counter data plug unit 16a. Correspondingly to the recess 72a, the housing unit 46a has a further recess 74a at a lower edge 112a of the cover element 52a, which faces toward the counter data plug unit 16a. The upper edge 110a and the lower edge 112a are situated on the side 100a of the cover element 52a, which faces toward the rear wall 58a. FIG. 1 respectively shows a section of the upper edge 110a and of the lower edge 112a with the recess 72a and the further recess 74a.

The side walls 54a, 56a in each case have a ledge 64a on a side facing toward the hollow space 48a. In FIG. 2 it is clearly visible that a height extent of the ledge 64a is equal to a height extent of the rear wall 58a. A side 114a of the ledge 64a, which faces away from the bottom wall 60a, and a side 116a of the rear wall 58a, which faces away from the bottom wall 60a, are therefore situated in one plane, being arranged perpendicularly to each other.

On the side facing toward the hollow space 48a, respectively one guiding element 62a of the housing unit 46a is arranged on the side walls 54a, 56a. The guiding element 62a is on a side 66a facing toward the side wall 54a, 56a connected to the side wall 54a, 56a by substance-to-substance bond. On a side 68a of the guiding element 62a that faces toward the hollow space 48a, the guiding element 62a defines a semicircle-shaped bulge 70a projecting into the hollow space 48a. The guiding element 62a extends over a height extent of the side 96a, 98a of the side wall 54a, 56a, which faces away from the bottom wall 60a and protrudes beyond said sides 96a, 98a.

In an insertion of the printed circuit board 24a the guiding element 62a is configured for a correct positioning with the housing unit 46a. For this purpose the printed circuit board 24a has on sides 120a, 122a, which face toward the side walls 54a, 56a, in each case a pilot hole 124a. The guiding element 62a is adapted to a shape of the pilot hole 124a. In the mounted state the housing unit 46a and the printed circuit board 24a are connected to each other via the pilot hole 124a and the guiding element 62a. The pilot hole 124a is configured for fixing the printed circuit board 24a to the housing unit 46a together with the guiding element 62a.

For indicating a power supply capability of the counter data plug unit 16a, the data plug unit 14a comprises at least one output unit 18a. The output unit 18a is connected to the printed circuit board 24a for electrical supply. FIG. 3 shows that in a method step in a production of the blind plug 12a, the printed circuit board 24a is inserted into the housing unit 46a with an underside 78a of the printed circuit board 24a along a mounting direction 118a. As a result, the housing unit 46a and the underside 78a of the printed circuit board 24a together form the at least substantially closed hollow space 48a. The housing unit 46a is configured to accommodate the output unit 18a. The output unit 18a is arranged on the underside 78a of the printed circuit board 24a. If the printed circuit board 24a is fixed with the housing unit 46a, the output unit 18a is positioned in the hollow space 48a. As can be seen in FIGS. 5 and 6, the output unit 18a comprises at least one lighting member, which is embodied as an LED 20.a The output unit 18a further comprises at least one further LED 22a as a further lighting member. The LED 20a and the further LED 22a are arranged on the underside 78a of the printed circuit board 24a. In the mounted state, the LED 20a and the further LED 22a are thus located in at least the hollow space 48a. For indicating the power supply capability of the counter data plug unit 16a by means of the LED 20a and the further LED 22a, the housing unit 46a is implemented at least partly transparent.

In the following the implementation of the printed circuit board 24a shall be described in detail on the basis of FIGS. 3, 4 and 5 as well as the schema of the printed circuit board 24a in FIG. 6. While FIGS. 3 and 4 show an upper side 76a of the printed circuit board 24a, an implementation of the underside 78a of the printed circuit board 24a may be perceived in FIG. 5.

For a contacting with counter contacts (not shown) of the counter data plug unit 16a, the printed circuit board 24a comprises contacts 101a, 102a, 103a, 104a, 105a, 106a, 107a, 108a. The contacts 101a, 102a, 103a, 104a, 105a, 106a, 107a, 108a are arranged in recesses on a side 26a that faces toward the counter data plug unit 16a.

The printed circuit board 24a comprises at least one first conduction path 28a, which connects at least a first one of the contacts 101a, 102a to a first terminal 30a of the LED 20a in an electrically conductive manner. The printed circuit board 24a further comprises a second conduction path 32a, which connects at least a second one of the contacts 103a, 106a to a second terminal 34a of the LED 20a in an electrically conductive manner. Via the first conduction path 28a and via the second conduction path 32a the LED 20a is connected to at least two of the contacts 101a, 102a, 103a, 106a in an electrically conductive manner (see FIG. 5).

The printed circuit board 24a comprises at least one further first conduction path 36a, which connects at least one further first one of the contacts 107a, 108a to a further first terminal 38a of the further LED 22a in an electrically conductive manner. The printed circuit board 24a further comprises a further second conduction path 40a, which connects at least one further second one of the contacts 104a, 105a to a further second terminal 42a of the further LED 22a in an electrically conductive manner. Thus the further LED 22a is connected to at least further two of the further contacts 104a, 105a, 107a, 108a in an electrically conductive manner via the further first conduction path 36a and the further second conduction path 40a (see FIG. 5).

In the present exemplary implementation FIG. 5 shows that the first terminal 30a, the second terminal 34a, the further first terminal 38a and the further second terminal 42a are arranged on the underside 78a of the printed circuit board 24a.

The schema of the printed circuit board 24a illustrated in FIG. 6 shows that the first conduction path 28a has a first conduction path section 80a and an additional first conduction path section 82a. The first conduction path section 80a is connected to the first contact 101a and the additional first conduction path section 82a is connected to an additional first contact 102a. Herein the first contact 101a and the additional first contact 102a are neighboring. Furthermore, the second conduction path 32a comprises a second conduction path section 84a and an additional second conduction path section 90a. The second conduction path section 84a is connected to the second contact 103a and the additional second conduction path section 90a is connected to an additional second contact 106a. FIGS. 4 and 6 show that the first conduction path section 80a is short-circuited with the additional first conduction path section 82a on the upper side 76a of the printed circuit board 24a. Furthermore, the second conduction path section 84a is short-circuited with the additional second conduction path section 90a on the upper side 76a of the printed circuit board 24a.

The schema of the printed circuit board 24a illustrated in FIG. 6 moreover shows that the further first conduction path 36a has a further first conduction path section 92a and a further additional first conduction path section 94a. The further first conduction path section 92a is connected to the further first contact 107a and the further additional first conduction path section 94a is connected to a further additional first contact 108a. Herein the further first contact 107a and the further additional first contact 108a are neighboring. Furthermore, the further second conduction path 40a has a further second conduction path section 86a and a further additional second conduction path section 88a. The further second conduction path section 86a is connected to the further second contact 104a and the further additional second conduction path section 88a is connected to a further additional second contact 105a. Herein the further second contact 104a and the further additional second contact 105a are arranged neighboring each other. FIGS. 4 and 6 show that the further first conduction path section 92a is short-circuited with the further additional first conduction path section 94a on the upper side 76a of the printed circuit board 24a. It can moreover be perceived in FIGS. 4 and 6 that the further second conduction path section 86a is short-circuited with the further additional second conduction path section 88a on the upper side 76a of the printed circuit board 24a.

For an electrical connection between the upper side 76a of the printed circuit board 24a and the underside 78a of the printed circuit board 24a, the first conduction path 28a and the second conduction path 32a and the further first conduction path 36a and the further second conduction path 40a extend over an edge 44a of the printed circuit board 24a. The edge 44a is situated on the side 26a of the printed circuit board 24a that faces toward the counter data plug unit 16a.

In FIGS. 7 to 10 a further exemplary embodiment of the invention is illustrated. The following description is essentially limited to the differences between the exemplary embodiments, wherein regarding components, features and functions which remain the same the description of the exemplary embodiment of FIGS. 1 to 6 may be referred to. In order to distinguish between the exemplary embodiments, the letter a, which has been added to the reference numerals of the exemplary embodiment in FIGS. 1 to 6, has been replaced by the letter b in the reference numerals of the exemplary embodiment in FIGS. 7 to 10. Regarding components having the same denomination, in particular regarding components having the same reference numerals, the drawings and/or the description of the exemplary embodiment of FIGS. 1 to 6 may principally be referred to.

FIG. 7 shows a blind plug 12b of a further exemplary embodiment. The blind plug 12b comprises a data plug unit 14b with at least one printed circuit board 24b. The blind plug 12b comprises a housing unit 46b. The printed circuit board 24b is connected to the housing unit 46b. The blind plug 12b of the present exemplary embodiment differs from the blind plug 12a of the exemplary embodiment a at least in an arrangement and/or connection of the printed circuit board 24b with and/or to the housing unit 46b. In the present case the printed circuit board 24b is inserted in the housing unit 46b parallel to an insertion direction. FIG. 7 illustrates a mounting direction 118b, which runs parallel to the insertion direction. The printed circuit board 24b is inserted in the housing unit 46b along the mounting direction 118b.

In the present implementation the housing unit 46b comprises at least one guiding web 132b. The housing unit 46b further comprises a further guiding web 136b, which is arranged opposite the guiding web 132b. The printed circuit board 24b is inserted in the housing unit 46b along the guiding web 132b and the further guiding web 136b (see FIGS. 8 to 10). In a mounted state, the printed circuit board 24b lies upon the guiding web 132b and the further guiding web 136b. FIGS. 7 to 10 show that in the present case a region below the printed circuit board 24b and within the housing unit 46b is empty. Alternatively, this region could be filled at least partly with at least one material and/or with a material composition, like for example a synthetic material and/or a resin and/or a composite material.

In the present case, the housing unit 46b comprises at least one fiber optic 126b, which deflects a light path at least once (see FIGS. 9 and 10). In this exemplary implementation the housing unit 46b forms the fiber optic 126b. The data plug unit 14b comprises an output unit 18b having at least one lighting member 20b. The output unit 18b has at least one further lighting member 22b. In the present case, the printed circuit board 24b is arranged in the housing unit 46b in such a way that at least the lighting member 20b and/or the further lighting member 22b are/is aligned at least substantially perpendicularly to an entry region 138b of the fiber optic 126b (see FIG. 10). The entry region 138b of the fiber optic 126b is in the present case adapted to a dimension and/or shape and/or size of the lighting member 20b and/or of the further lighting member 22b. The fiber optic 126b is configured for guiding light provided by the lighting member 20b and/or the further lighting member 22b directly and, in the present case, unprocessed toward at least one front side 128b of the housing unit 46b (see FIG. 10).

The blind plug 12b of the present exemplary embodiment furthermore differs from the blind plug 12a of the exemplary embodiment a by a different implementation of a fixing element 50b of the housing unit 46b. The fixing element 50b is in the present case embodied as a latch tab lever 140b (see FIGS. 7 to 10). The fixing element 50b is configured, in the mounted state, to create a clamping effect and/or a latch connection of the data plug unit 14b with a counter data plug unit (not shown).

The invention claimed is:

1. A blind plug with at least one data plug unit, which is configured for a connection to a counter data plug unit, wherein the data plug unit comprises an output unit, which is configured to indicate a power supply capability of the counter data plug unit, wherein the data plug unit has at least one printed circuit board comprising contacts for a contacting with counter contacts of the counter data plug unit, wherein the output unit permits a determination whether the counter data plug unit is a classic Ethernet terminal or a Power over Ethernet terminal, wherein the output unit comprises at least one lighting member and wherein the printed circuit board comprises at least one first conduction path, which connects a first one of the contacts to a first terminal of the lighting member in an electrically conductive manner, and at least one second conduction path, which connects a second one of the contacts to a second terminal of the lighting member in an electrically conductive manner, the lighting member being connected in an electrically conductive manner to at least two of the contacts via the first conduction path and the second conduction path, wherein the output unit comprises a further lighting member and the printed circuit board comprises at least one further first conduction path connecting, in an electrically conductive manner, a further first one of the contacts to a further first terminal of the further lighting member, and comprises at least one further second conduction path connecting, in an electrically conductive manner, a further second one of the contacts to a further second terminal of the further lighting member, the further lighting member being connected in an electrically conductive manner to at least further two of the further contacts via the further first conduction path and the further second conduction path.

2. The blind plug according to claim 1, wherein in at least one operation state at least one electrical parameter of the output unit is below or above a limit value of the electrical parameter for a detection as a Power Device.

3. The blind plug according to claim 1, wherein the output unit comprises at least one lighting member.

4. The blind plug according to claim 1, wherein the first conduction path and/or the second conduction path extend/s over an edge of the printed circuit board.

5. The blind plug according to claim 1, wherein housing unit comprises at least one fixing element, which is configured for a fixation of the data plug unit with the counter data plug unit.

6. The blind plug according to claim 1, wherein the housing unit comprises at least one cover element, which covers the counter data plug unit in a flush-mounted manner.

7. A data transmission system with a blind plug according to claim 1 and with the counter data plug unit which the blind plug is connected to.

8. The blind plug according to claim 1, further comprising a housing unit, which is configured to accommodate at least the output unit.

9. The blind plug according to claim 8, wherein the housing unit is implemented at least partially transparent.

10. The blind plug according to claim 8, wherein the housing unit comprises at least one fiber optic, which deflects a light path at least once.

11. The blind plug according to claim 8, wherein the printed circuit board is inserted in the housing unit parallel to an insertion direction.

12. The blind plug according to claim 8, wherein the data plug unit has at least one printed circuit board comprising contacts for a contacting with counter contacts of the counter data plug unit and wherein the housing unit is connected to the printed circuit board.

13. The blind plug according to claim 12, wherein the housing unit and the printed circuit board together form an at least substantially closed hollow space, which the output unit is arranged in.

14. A method for indicating a power supply capability of the counter data plug unit, wherein a blind plug according to claim 1 is connected to the counter data plug unit and the power supply capability is indicated by the output unit.

15. The method according to claim 14, wherein the output unit is supplied by a Power Sourcing Equipment via a detection signal for a detection of a Power Device.

* * * * *